(12) United States Patent
Williamson et al.

(10) Patent No.: US 10,699,875 B2
(45) Date of Patent: Jun. 30, 2020

(54) CONFOCAL IMAGING TECHNIQUE IN A CHARGED PARTICLE MICROSCOPE

(71) Applicant: FEI Company, Hillsboro, OR (US)

(72) Inventors: Mark Williamson, Hillsboro, OR (US); Andrew Barnum, Hillsboro, OR (US); Dong Tang, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/188,480

(22) Filed: Nov. 13, 2018

(65) Prior Publication Data

US 2020/0152420 A1  May 14, 2020

(51) Int. Cl.
*H01J 37/28* (2006.01)
*H01J 37/22* (2006.01)
*H01J 37/32* (2006.01)
*H01J 37/26* (2006.01)

(52) U.S. Cl.
CPC ............ *H01J 37/28* (2013.01); *H01J 37/222* (2013.01); *H01J 37/261* (2013.01); *H01J 37/3233* (2013.01)

(58) Field of Classification Search
CPC ........ H01J 37/28; H01J 37/222; H01J 37/261; H01J 37/3233
USPC .......................... 250/306, 307, 309, 310, 311
See application file for complete search history.

(56) References Cited

U.S. PATENT DOCUMENTS

| | | | | |
|---|---|---|---|---|
| 2011/0242520 A1* | 10/2011 | Kosugi | ................... | G03F 7/706 355/77 |
| 2014/0298153 A1* | 10/2014 | Tsujimoto | ............... | G06T 11/00 715/232 |
| 2019/0170646 A1* | 6/2019 | Fiolka | ................ | G01N 21/6458 |

\* cited by examiner

*Primary Examiner* — Nicole M Ippolito

(57) ABSTRACT

Methods and systems for charged particle microscope confocal imaging are disclosed herein. An example method includes obtaining a plurality of probe images of a portion of a sample, each probe image of the plurality of probe images obtained at a different focal depth within the sample, applying a virtual aperture to each probe image of the plurality of probe images to form a respective plurality of confocal images, and forming a three-dimensional reconstruction of the sample based on the plurality of confocal images.

21 Claims, 4 Drawing Sheets

```
401
```

Obtain a plurality of probe images of a portion of a sample, each probe image of the plurality of probe images obtained at a different focal depth within the sample

403

↓

Apply a virtual aperture to each probe image of the plurality of probe images to form a respective plurality of confocal images

405

↓

Form a three-dimensional reconstruction of the sample based on the plurality of confocal images

407

CONFOCAL IMAGING TECHNIQUE IN A CHARGED PARTICLE MICROSCOPE

The invention relates to a method of using a Scanning Transmission Charged Particle Microscope for obtaining and processing confocal images of a sample, where the confocal images may be obtained at different focal depths within the image and lead to a three-dimensional reconstruction of the sample. The confocal images are generated by applying a virtual aperture to the image data post imaging.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g., a FIB-SEM), which additionally employ a "machining" Focused Ion Beam (FIB), allowing supportive activities such as ion-beam milling, Ion-Beam-Induced Deposition (IBID) and/or Ion-Beam-Induced-Etching (IBIE), for example. More specifically:

In an SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.

In a TEM, the electron beam used to irradiate the specimen is chosen to be of a high-enough energy to penetrate the specimen (which, to this end, will generally be thinner than in the case of an SEM specimen); the transmitted electrons emanating from the specimen then enter an imaging system, which directs them onto a detector. When such a TEM is operated in scanning mode (thus becoming an STEM), the detector output in question will be accumulated during a scanning motion of the irradiating electron beam.

An SEM can also be used in "transmission mode", e.g., when using relatively thin samples and a relatively high incident beam energy. Such a tool is often called a "TSEM" (Transmission SEM), and it will typically have a relatively rudimentary imaging system (e.g., a single lens and deflector) disposed between the specimen and post-specimen detector.

As an alternative to the use of electrons as irradiating beam, charged particle microscopy can also be performed using other species of charged particle. In this respect, the phrase "charged particle" should be broadly interpreted as encompassing electrons, positive ions (e.g., Ga or He ions), negative ions (such as oxygen), protons and positrons, for instance.

It should be noted that, in addition to imaging and performing (localized) surface modification (e.g., milling, etching, deposition, etc.), a CPM may also have other functionalities, such as examining diffractograms, conducting spectroscopy, studying ion channeling/ion backscattering (Rutherford Backscattering Spectrometry), etc.

In all cases, a Scanning Transmission Charge Particle Microscope (STCPM) will comprise at least the following components:

A charged particle source, such as:
  A Cold Field Emission Gun (CFEG), Schottky electron source ("hot FEG"), thermionic source, etc., in the case of electrons;
  A Liquid Metal Ion Source (LMIS), Nano-Aperture Ion Source (NAIS) or RF-generated ion plasma source, for example, in the case of ions.
An illuminator (illuminating particle-optical column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component as well. If desired, the illuminator can be provided with a deflector system (beam scanning assembly) that can be invoked to cause its exit beam to perform a scanning motion across the specimen being investigated.
A specimen holder—generally connected to a positioning system and/or stage—on which a specimen under investigation can be held and positioned (e.g., displaced, tilted, rotated). If desired, this holder can be moved by said stage (specimen scanning assembly) so as to effect scanning motion of the specimen with respect to the beam. When intended to hold cryogenic specimens, the specimen holder can be provided with a suitable cooling device.
An imaging system (imaging particle-optical column), which essentially takes charged particles that are transmitted through a specimen (plane) and directs (focuses) them onto a detector. As with the illuminator referred to above, the imaging system may also perform other functions, such as aberration mitigation, cropping, filtering, etc., and it will generally comprise one or more charged-particle lenses and/or other types of particle-optical components.
A detector, which may be unitary or compound/distributed in nature, and can take many different forms, depending on what it is intended to detect. It may, for example, comprise one or more photodiodes, CMOS detectors, CCD detectors, photovoltaic cells, etc.

An additional imaging technique that CPMs may implement is STEM confocal imaging, which is also referred to as Scanning Confocal Electron Microscopy (SCEM). The basic principle behind this technique is to perform imaging using only a relatively confined region of the focal plane, proximal to the particle-optical axis of the imaging beam for example. Focal confinement in this manner allows an image to be constructed using only information from a relatively flat (low-aberration) paraxial part of the focal plane—which therefore has a much more defined focal/axial position on/in a specimen—thus offering higher-resolution imagery. This, in turn, allows so-called "particle-optical sectioning" to be performed, whereby volumetric/three-dimensional imagery can be reconstructed on the basis of an image stack of planar/two-dimensional images captured at a series of different focal depths within a specimen. Conventionally, such focal confinement is achieved by using a narrow physical aperture (diaphragm/spatial filter) to allow only a relatively small (central) portion of the flux leaving the STEM's imaging system to impinge upon the employed (imaging) detector—a mechanism that can also be referred to as flux throttling.

It is an object of the present disclosure to provide an alternative method of performing confocal imaging in an STCPM, which may be more versatile than conventional techniques. The disclosed technique implements/applies a virtual aperture to image data to form confocal images, as they are referred to herein. This is in contrast to proactive application of a throttling aperture to said flux.

In general, the disclosed techniques allow the (pixelated) detector to register the full (or "nominal") flux that it can accept, and then retroactively "edit" this full flux, so that only a relatively small (and easily adjustable) portion thereof is actually used in image assembly, e.g., application of the virtual aperture to the captured detector data. This a posteriori method contrasts fundamentally with the conventional approach, which throttles the flux a priori so that the detector is only exposed to a small region thereof ab initio. The techniques disclosed herein have a number of distinct advantages, such as the following to name a few:

The throttling aperture used in the conventional method is obviated. This simplifies the particle-optical column design, and also entails one less aperture to suffer from degradation (and the need for regular replacement) due to beam etching.

A full set of "raw" detector data is captured (and optionally stored), for editing ex post facto. This allows different types of editing to be retrospectively applied to a single set of data—e.g., regarding the location, size and/or shape of the confined portion to be used in image assembly (i.e., the size and location of the virtual aperture can be varied to evaluate the different images)—without having to repeat multiple specimen imaging sessions with different throttling apertures (with the attendant cumulative radiation damage to the specimen).

The raw nature of the captured/stored detector data also allows a given dataset to be used for "regular" imaging, as opposed—or in addition—to confocal imaging.

The abovementioned "editing" is done by applying a virtual aperture to the detector data, e.g., using an algorithm (software/firmware) to only select detector data corresponding to a particular "zone" of a given location, shape (e.g., circular, oval, square, etc.) and size on the detection surface.

A further advantage of the disclosed techniques concern the scanning strategy/mechanism used by the scanning assembly—which, in principle, can include one or both of:
  Specimen motion relative to the particle-optical axis; and
  Beam deflection.

The first of these (specimen motion) is not typically applied in conventional SEMs/STEMs, which instead tend to rely on beam deflection; this is inter alia because of drift effects/hysteresis typically associated with stage motion necessary to displace the specimen. However, beam deflection tends to be more challenging in a traditional SCEM implementing a physical aperture than in a conventional SEM/STEM, because the presence of the aforementioned flux throttling aperture—which typically has a much smaller (pinhole-like) opening than the detection surface of the detector—places greater positioning tolerance demands on the employed beam deflection system. More specifically:
  If a beam scan is implemented above the specimen, then a beam de-scan will generally be performed after the specimen, so as to (strive to) maintain a constant beam position on the detector;
  It is clear that such a de-scan can afford to be somewhat less accurate if the post-specimen beam only has to land on a (relatively large) detection surface rather than first having to pass through a (relatively narrow) throttling aperture.

For this reason, since the techniques disclosed herein remove the need for the throttling aperture, beam scanning in the disclosed STCPM is basically no more challenging than in a conventional SEM/STEM.

In an embodiment of the invention:
  A focusing assembly is used to produce stepwise relative displacement of said beam and specimen parallel to said optical axis, so as to produce an axial position series, e.g., image at different focal depths within the specimen;
  A confocal image is acquired for each axial position in said series; and
  The series of confocal images, each obtained at a different focal depth, are combined to form a 3D reconstruction of at least part of the specimen.

Such a procedure enables the aforementioned "particle-optical sectioning" to be performed, and allows a 3D image of (part of) the specimen to be reconstructed from the 2D image stack acquired during said axial position series. An advantage of the techniques disclosed herein is that, if desired, a different (tunable) virtual aperture can be retrospectively chosen/applied for different members of said image stack; for example, one could choose to progressively narrow the virtual aperture as a function of penetration depth into the specimen.

In a particular embodiment:
  Said focusing assembly adjusts said illuminator so as to produce stepwise displacement of a focal plane of said beam within the specimen;
  Said imaging system is concurrently adjusted so as maintain flux focus in said image plane.

In analogy to the lateral scanning motion discussed above, axial beam/specimen relative positional adjustment can, in principle, be performed to change the location of the focal plane within the sample using at least one of:
  Specimen motion along the particle-optical axis; and
  Focal plane adjustment.

Once again, the first of these (specimen motion) tends to be a relatively unattractive option, inter alia because of the aforementioned drift effects/hysteresis typically associated with stage motion necessary to displace the specimen. The second option—focal plane adjustment—is once again facilitated by the absence of the aforementioned throttling aperture. This is because—for anything other than perfectly-aligned on-axis traversal of an aberration-free imaging system—adjusting the focal plane position will tend to cause a (small) amount of lateral image shift. Such shift is less of an issue if the post-specimen beam only has to land on a (relatively large) detection surface rather than first having to pass through a (relatively narrow) throttling aperture.

Although in many cases the virtual aperture disclosed herein will be used to select a confined central portion of the detector data (i.e. substantially centered on the particle-optical axis), this does not necessarily have to be the case, and one could alternatively choose an eccentrically-located confined portion, if desired. The size of the confined portion is also purely a matter of choice; by way of (non-binding) example, one could choose a confined portion whose area is <10% of the area of the "nominal" flux spot/blob incident on the detector, but other area fractions are also possible. Typically, the confined portion will be substantially circular in shape, but this is also discretionary, and one could instead choose another shape (such as elliptical or polygonal, for instance), if desired. As regards the detector used, any pixelated detector—such as a CCD or CMOS detector—is, in principle, suitable; in essence, one can use any detector with a sub-divided detection surface containing distinct sectors that can be individually read out, including a cluster/swarm of discrete detector elements. In such a detector, one can conveniently sum the pixel (or sector) values within the applied virtual aperture so as to obtain a scalar sum value; however, there are also other possible strategies, such as (automatically) picking (and summing) the n brightest pixels in the confined portion, for example (where n is a selectable number). Selection of, and processing of the data in, the confined portion can be performed using proprietary image recognition software, for example, or using self-written algorithms. According to choice, image processing can be performed real time/on-the-fly on the data stream flowing from the detector, or the detector data can be stored and then processed at a later time, or a combination thereof.

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols.

Figure 1:
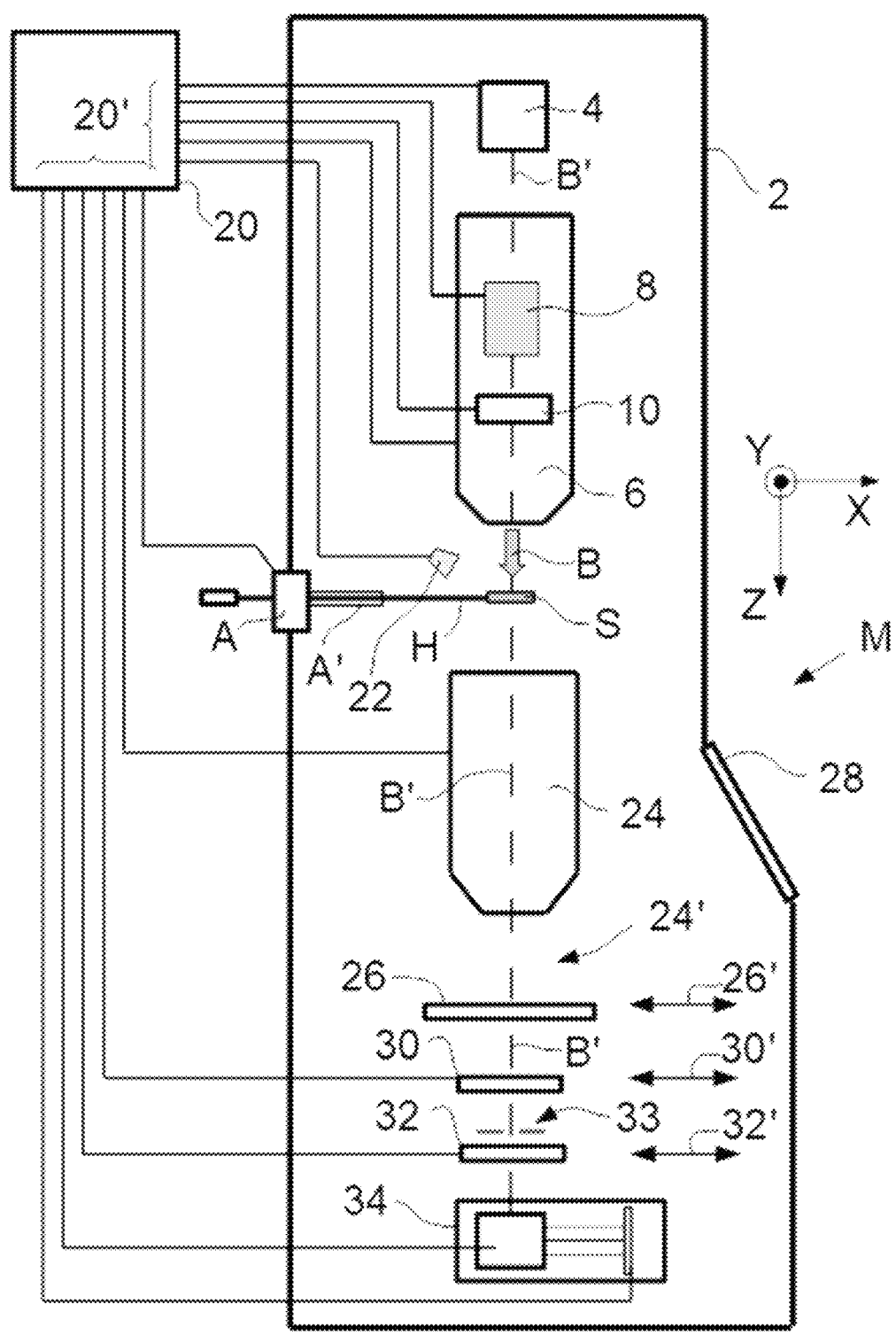
FIG. 1 renders a longitudinal cross-sectional elevation view of an embodiment of a STEM in which the present invention is implemented.

Embodiments of the present invention relate to obtaining confocal images of a sample using a virtual aperture applied to detector data after imaging the sample and further relates to forming 3D reconstructions based on the obtained images. However, it should be understood that the methods described herein are generally applicable to a wide range of different AI enhanced metrology, and should not be considered limiting.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Additionally, in the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, separated from a wafer, or packaged for use on a circuit board. The term "FIB" or "focused ion beam" is used herein to refer to any collimated ion beam, including a beam focused by ion optics and shaped ion beams.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

FIG. 1 (not to scale) is a highly schematic depiction of an embodiment of a STCPM M in which the present invention is implemented; in particular, the Figure shows a STEM, though, in the context of the present invention, it could alternatively be a TSEM or an ion microscope, for example. In the Figure, within a vacuum enclosure 2, an electron source 4—such as a Schottky FEG—produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 10, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate contact with the specimen holder H, so as to maintain it (and the specimen S thereupon) at cryogenic temperatures, for example.

Optionally present in the illuminator 6 is a monochromator 8. The source 4 radiates rays (electron paths) in a variety of directions, and these rays pass into a disperser/particle prism in such a monochromator 8, where dispersion occurs, i.e. a differential deflection that depends on the exact energy of the particle passing along a given nominal path/ray, which causes a spectral spread in the various rays. A monochromator slit can then be used to select a relatively narrow sub-section of this spectral spread, thus passing only a selected energy range.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of sensor 22, which might be a combined scintillator/photomultiplier or EDX (Energy-Dispersive X-Ray Spectroscopy) module, for instance; in such a case, an image could be constructed using basically the same principle as in an SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of field of the electron flux leaving imaging system 24 is generally quite large (e.g., of the order of 1 meter). Consequently, various types of detector can be used downstream of screen 26, such as:

TEM camera 30. At TEM camera 30, electron flux B" can form a static image or diffractogram that can be processed by controller/processor 20 and displayed on a display device (not depicted), such as a flat panel display, for example. When not required, TEM camera 30 can be retracted/withdrawn (as schematically indicated by arrows 30') so as to get it out of the way of axis B'.

STEM camera 32. An output from STEM camera 32 can be recorded as a function of (X,Y) scanning position of the beam B on the specimen S, and an image can be constructed that is a "map" of output from STEM camera 32 as a function of X,Y. STEM Camera 32 can comprise a single pixel with a diameter of e.g., 20 mm, as opposed to the matrix of pixels characteristically present in TEM camera 30. Moreover, STEM camera 32 will generally have a much higher acquisition rate (e.g., $10^6$ points per second) than TEM camera 30 (e.g. $10^2$ images per second). Once again, when not required, STEM camera 32 can be retracted/withdrawn (as schematically indicated by arrows 32') so as to get it out of the way of axis B' (although such retraction would not be a necessity in the case of a donut-shaped annular dark field STEM camera 32, for example; in such a camera, a central hole would allow flux passage when the camera was not in use).

As an alternative to imaging using cameras 30 or 32, one can also invoke spectroscopic apparatus 34, which, in the current example, is an EELS module.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g., of the order of 1 cm in diameter) through which the employed electron beam passes, but widening out to accommodate structures such as the source 4, specimen holder H, screen 26, TEM camera 30, STEM camera 32, spectroscopic apparatus 34, etc.

Of importance in the context of the present disclosure is flux throttling aperture 33—which is employed in a conventional SCEM, but is obviated by the present disclosed techniques. In a conventional SCEM, this throttling aperture 33 is positioned so as to admit to STEM detector 32 only a confined (central) portion of the electron flux that traverses the specimen S and imaging system 24. In contrast, the disclosed techniques do not "clip"/curtail the flux a priori in this manner; instead, a full/nominal flux is allowed to fall on pixelated detector 30, and data from a desired number of pixels centered on the probe beam are then used to form the image. In some embodiments, all of the detector data is stored/read out and is subsequently "edited" by a posteriori application of a virtual (software-generated) aperture thereto. In other embodiments, only detector data from a region of the detector centered on the probe beam is read out and used in the imaging process.

Figure 2A:
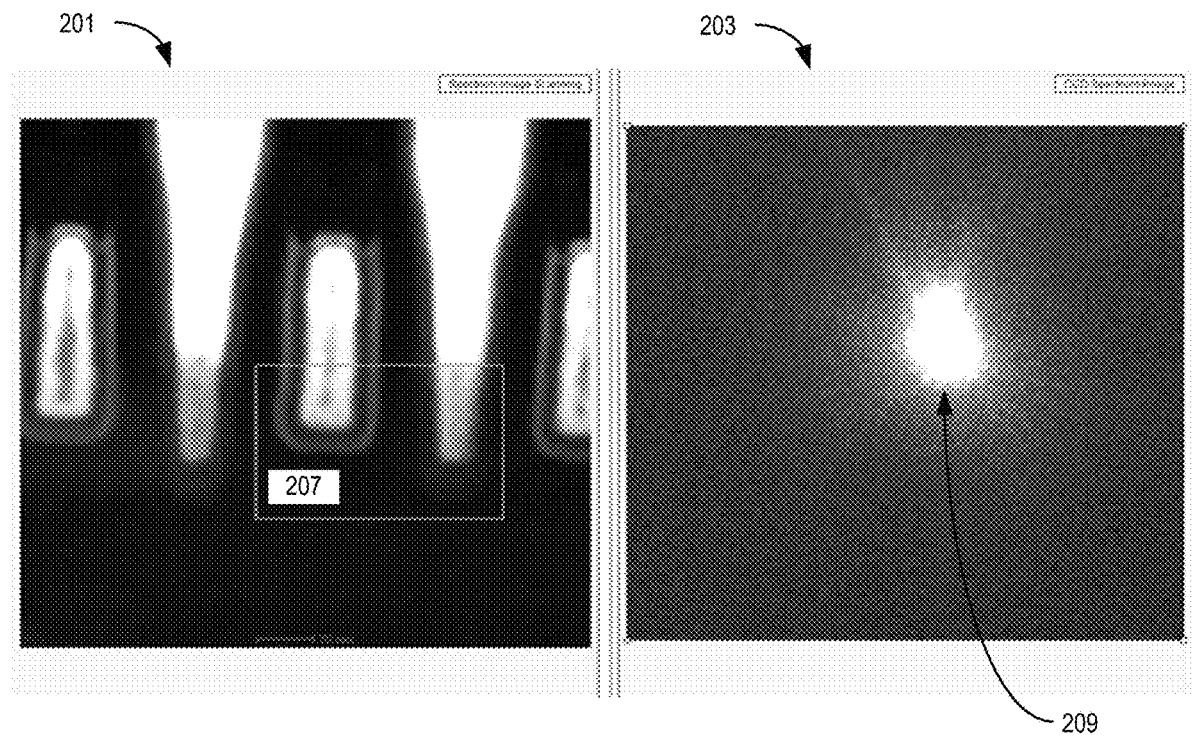
FIGS. 2A and 2B illustrate certain aspects of the present invention, as applied to the imaging of part of a semiconductor device.
Figure 2B:
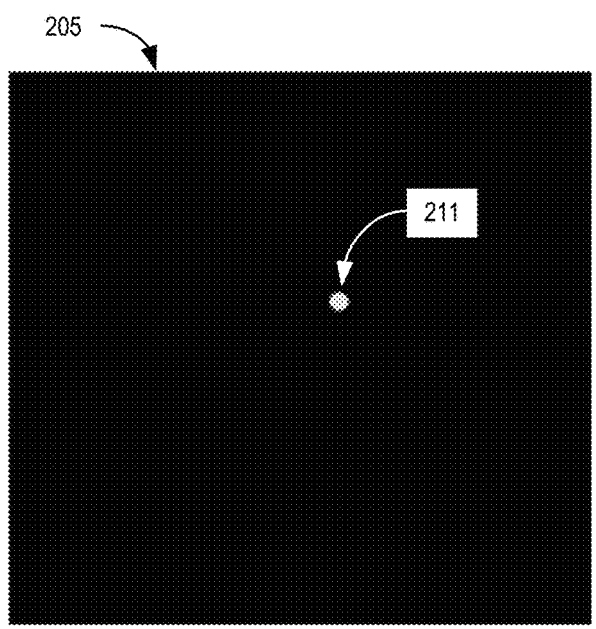

FIGS. 2A and 2B illustrate certain aspects of the present disclosure, as applied to the imaging of part of a semiconductor device S.

The left part of FIG. 2A depicts a TEM image 201 of this semiconductor device S, and shows a rectangular box 207 within which STEM scanning was performed. The right part of FIG. 2A shows registered pixelated detector data 203 at a given scan point within the box; the data comprise a "blob" of light 209, which changes in shape/size/internal structure as a function of (two-dimensional and/or three-dimensional) scan position within the box. Note that the full "blob" 209 is registered by TEM detector 30 or STEM detector 32.

FIG. 2B shows a virtual aperture 211 that is applied (by software) ex post facto to the gathered detector data, in accordance with the present disclosure. As shown, the virtual aperture 211 is a confined circular region, selected so as to be proximal to/substantially centered on the location on the detector where the blob shown in the right side of FIG. 2A lands, e.g., the particle optical axis B' for this scan location. In some embodiments, the pixelwise intensity within this virtual aperture 211 can be summed so as to yield a single scalar value for this confocal image. This scalar value—per scan position (2D)—was then used to assemble a SCEM image. By repeating this procedure at a selection of different Z-positions within the specimen S, a series/train of "depth-sectioned" SCEM images was obtained. In other embodiments, only a desired number of pixels within the virtual aperture data set may be summed, such as the n brightest pixels, to form the scalar value, where n can be any number less than or up to the number of pixels within the virtual aperture. In some examples, n is five, but that number is not limiting on the present disclosure.

Figure 3:
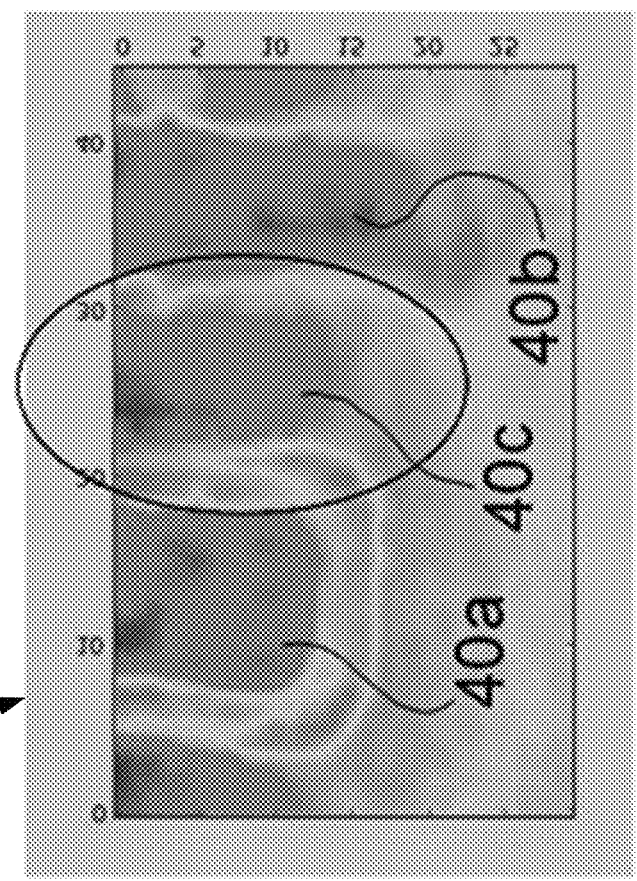
FIG. 3 shows comparative SCEM and STEM imagery for the subject of FIG. 2A.
Figure 3:
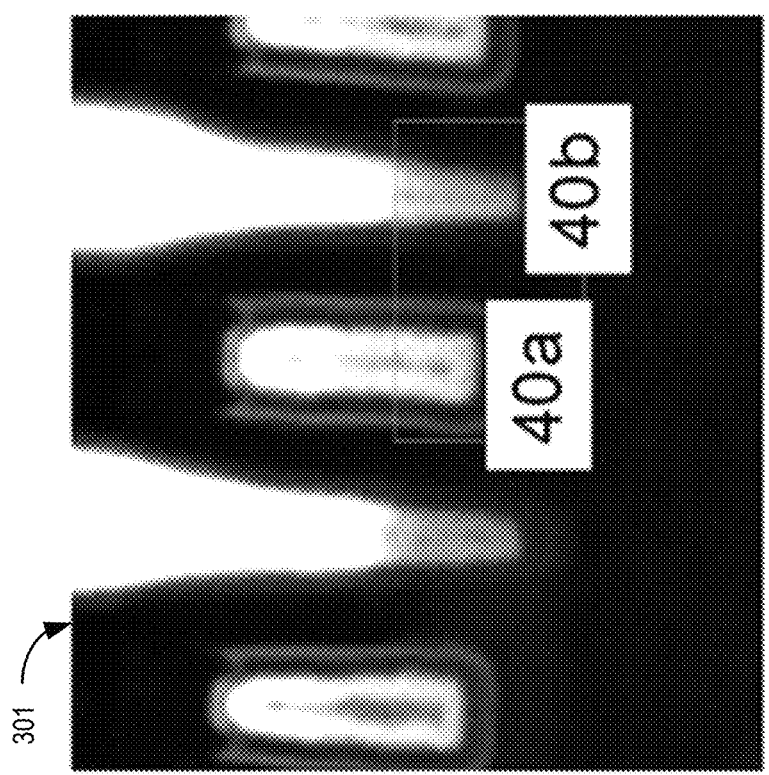

The right part of FIG. 3 shows an example of such a SCEM image 313, taken at a particular Z-depth within the specimen S. It reveals a faint intermediate feature 40c (within the black oval) that is not visible in the corresponding STEM image 301 on the left of the Figure, which shows only the flanking features 40a and 40b. Clearly, obtaining images at different focal depths within the specimen provides information about features within the specimen not visible by imaging at only a top surface focal plane.

Figure 4:
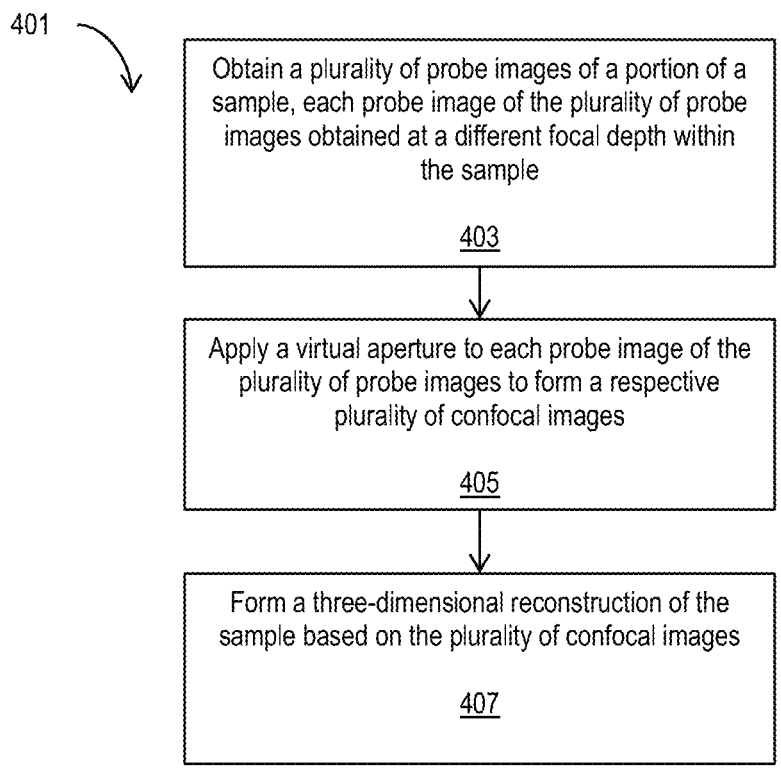
FIG. 4 is an example method flow diagram in accordance with an embodiment of the present disclosure.

FIG. 4 is a method for forming a three-dimensional reconstruction of a sample in accordance with an embodiment of the present disclosure. The method 401 may be implemented on a charged particle microscope, such as the system M of FIG. 1, or may be implemented on computing systems receiving imaging data from the charged particle microscope and combinations thereof. For example, the imaging process of method 401 may be implemented by a charged particle microscope, whereas the image processing steps may be implemented by any computing system coupled to receive the image data from the charged particle microscope.

The method 401 may begin at process block 403, which includes obtaining a plurality of probe images of a portion of a sample, each probe image of the plurality of probe images obtained at a different focal depth within the sample. Additionally, there may be several sets of images obtained at different focal depths so that a 3D reconstruction of a desired area may be obtained, such as the entire box 207 of FIG. 2A.

Process block 403 may be followed by process block 405, which includes applying a virtual aperture to each probe image of the plurality of probe images to form a respective plurality of confocal images. In some embodiments, the application of the virtual image may be performed at the time of data read out from the detector. In other embodiments, all of the detector data may be read out and stored so that one or more virtual apertures may be applied to the data at a later time. For example, a virtual aperture of a desired size and shape may be applied to the plurality of probe images to form the respective plurality of confocal images. These images may then be reviewed, and, if desired, the plurality of probe images may be re-processed with a virtual aperture of a different size and/or shape to obtain a different plurality of confocal images based on the different virtual aperture shape/size.

Process block 405 may be followed by process block 407, which includes forming a 3D reconstruction of the sample based on the plurality of confocal images. The 3D reconstruction may be formed by any technique known in the art, and results in a 3D reconstruction of at least a part of the sample that can be viewed in any orientation. In general, the 3D reconstruction may review features within the sample that are not visible from surface images, and which may provide additional insight into the sample features.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections. In addition, the values selected may be obtained by numerical or other approximate means and may only be an approximation to the theoretically correct/value.

The invention claimed is:

1. A method comprising:
    obtaining a plurality of probe images of a portion of a sample, each probe image of the plurality of probe images obtained at a different focal depth within the sample;
    applying a virtual aperture to each probe image of the plurality of probe images to form a respective plurality of confocal images, the virtual aperture being a confined region of a detector proximal to or centered on a location of the detector where the probe image was detected; and
    forming a three-dimensional reconstruction of the sample based on the plurality of confocal images.

2. The method of claim 1, wherein applying a virtual aperture to each probe image of the plurality of probe images to form a respective plurality of confocal images comprises selecting a subset of pixels from a plurality of pixels forming each of the plurality of probe images to form respective ones of the plurality of confocal images, wherein the subset of pixels includes a plurality of brightest pixels of the plurality of pixels, and wherein the plurality of pixels are within the confined region.

3. The method of claim 2, wherein the subset of pixels are summed to form respective one of the plurality of confocal images.

4. The method of claim 1, wherein applying a virtual aperture to each probe image of the plurality of probe images to form a respective plurality of confocal images comprises selecting a plurality of pixels from each probe image based on their proximity to an electron probe beam location impinging on the detector.

5. The method of claim 1, wherein applying a virtual aperture to each probe image of the plurality of probe images to form a respective plurality of confocal images comprises reading out pixel data from the detector from the confined region of the detector centered on a location of an impinging probe beam, wherein the confined region is less than all the pixels of the detector.

6. The method of claim 1, wherein applying a virtual aperture to each probe image of the plurality of probe images to form a respective plurality of confocal images comprises reading out all pixel data of the detector and applying the virtual aperture to all the pixel data subsequent the readout.

7. The method of claim 1, wherein obtaining a plurality of probe images of a portion of a sample, each probe image of the plurality of probe images obtained at a different focal depth within the sample comprises irradiating the sample with an electron beam and changing the focal depth with respect to a surface of the sample.

8. The method of claim 7, wherein changing the focal depth with respect to a surface of the sample comprises moving the sample in relation to the focal plane of the electron beam.

9. The method of claim 7, wherein changing the focal depth with respect to a surface of the sample comprises moving the focal plane in relation to the surface of the sample.

10. The method of claim 1, wherein an electron beam probe is rastered over an area of the sample at each focal depth.

11. The method of claim 1, wherein each of the plurality of probe images includes a sequence of probe images of an area of the sample obtained at each focal depth.

12. A system comprising:
an illuminator coupled to illuminate a sample with a beam of electrons;
an imaging system coupled to focus electron flux transmitted through the sample from the beam of electrons;
a detector coupled to detect the focused electron flux; and
a controller coupled to at least the illuminator, imaging system and detector, and including code that, when executed, causes the controller to:
obtain a plurality of probe images of a portion of a sample, each probe image of the plurality of probe images obtained at a different focal depth within the sample;
apply a virtual aperture to each probe image of the plurality of probe images to form a respective plurality of confocal images, the virtual aperture being a confined region of a detector proximal to or centered on a location of the detector where the probe image was detected; and
form a three-dimensional reconstruction of the sample based on the plurality of confocal images.

13. The system of claim 12, wherein the code that causes the controller to apply a virtual aperture to each probe image of the plurality of probe images to form a respective plurality of confocal images further includes code that, when executed, causes the controller to:
select a subset of pixels from a plurality of pixels forming each of the plurality of probe images to form respective ones of the plurality of confocal images, wherein the subset of pixels includes a plurality of brightest pixels of the plurality of pixels, and wherein the plurality of pixels are within the confined region.

14. The system of claim 13, wherein the code that causes the controller to form a respective plurality of confocal images further includes code that, when executed, causes the controller to sum the subset of pixels to form respective ones of the plurality of confocal images.

15. The system of claim 12, wherein the code that causes the controller to apply a virtual aperture to each probe image of the plurality of probe images to form a respective plurality of confocal images further includes code that, when executed, causes the controller to:
select a plurality of pixels from each probe image based on their proximity to an electron probe beam location impinging on the detector.

16. The system of claim 12, wherein the code that causes the controller to apply a virtual aperture to each probe image of the plurality of probe images to form a respective plurality of confocal images further includes code that, when executed, causes the controller to:
read out pixel data from the detector from the confined region of the detector centered on a location of an impinging probe beam, wherein the confined region is less than all the pixels of the detector.

17. The system of claim 12, wherein the code that causes the controller to apply a virtual aperture to each probe image of the plurality of probe images to form a respective plurality of confocal images further includes code that, when executed, causes the controller to:
read out all pixel data of the detector and applying the virtual aperture to all the pixel data subsequent the readout.

18. The system of claim 12, wherein the code that causes the controller to obtain a plurality of probe images of a portion of a sample, each probe image of the plurality of probe images obtained at a different focal depth within the sample comprises code that, when executed, causes the controller to irradiate the sample with an electron beam and changing the focal depth with respect to a surface of the sample.

19. The system of claim 18, wherein changing the focal depth with respect to a surface of the sample comprises moving the sample in relation to the focal plane of the electron beam.

20. The system of claim 18, wherein changing the focal depth with respect to a surface of the sample comprises moving the focal plane in relation to the surface of the sample.

21. The system of claim 12, wherein each of the plurality of probe images includes a sequence of probe images of an area of the sample obtained at each focal depth.

* * * * *